United States Patent
Bae et al.

(10) Patent No.: US 10,847,630 B2
(45) Date of Patent: Nov. 24, 2020

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Deok Han Bae, Hwaseong-si (KR); Jin Wook Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/364,551

(22) Filed: Mar. 26, 2019

(65) Prior Publication Data

US 2020/0058748 A1    Feb. 20, 2020

(30) Foreign Application Priority Data

Aug. 14, 2018   (KR) .................. 10-2018-0094973

(51) Int. Cl.
*H01L 29/423* (2006.01)
*H01L 29/49* (2006.01)
*H01L 27/088* (2006.01)
*H01L 29/66* (2006.01)
*H01L 29/51* (2006.01)
*H01L 21/8234* (2006.01)

(52) U.S. Cl.
CPC .............. *H01L 29/42376* (2013.01); *H01L 21/823456* (2013.01); *H01L 21/823468* (2013.01); *H01L 27/0886* (2013.01); *H01L 29/4238* (2013.01); *H01L 29/42364* (2013.01); *H01L 29/4983* (2013.01); *H01L 29/513* (2013.01); *H01L 29/6653* (2013.01); *H01L 29/6656* (2013.01); *H01L 29/66545* (2013.01); *H01L 21/823431* (2013.01)

(58) Field of Classification Search
CPC ....... H01L 29/42376; H01L 21/823456; H01L 21/823468; H01L 29/513; H01L 29/66545; H01L 29/6653; H01L 29/6656; H01L 27/0886; H01L 29/4238; H01L 29/42364; H01L 29/4983; H01L 21/823431; H01L 21/28114; H01L 29/4966; H01L 29/165; H01L 29/7848
See application file for complete search history.

(56) References Cited

U.S. PATENT DOCUMENTS

| | | | |
|---|---|---|---|
| 6,010,954 A * | 1/2000 | Ho | H01L 21/28114 257/344 |
| 8,871,582 B2 | 10/2014 | Pham et al. | |
| 8,872,286 B2 | 10/2014 | Cheng et al. | |
| 8,940,597 B2 | 1/2015 | Hsu et al. | |
| 9,240,453 B2 | 1/2016 | Oh | |
| 9,330,937 B2 | 5/2016 | Nowling et al. | |
| 2006/0006478 A1* | 1/2006 | Kanegae | H01L 21/28052 257/382 |
| 2017/0301776 A1 | 10/2017 | Zhang et al. | |

* cited by examiner

*Primary Examiner* — Syed I Gheyas
(74) *Attorney, Agent, or Firm* — Lee IP Law, P.C.

(57) ABSTRACT

A semiconductor device includes a substrate having an active region, a gate structure on the active region, the gate structure including a gate dielectric layer and a gate electrode layer, and the gate electrode layer having a rounded upper corner, and gate spacer layers on side surfaces of the gate structure, the gate spacer layers having an upper surface at a lower height level than an upper surface of the gate electrode layer.

19 Claims, 14 Drawing Sheets

SEMICONDUCTOR DEVICE AND METHOD OF MANUFACTURING THE SAME

CROSS-REFERENCE TO RELATED APPLICATION

Korean Patent Application No. 10-2018-0094973, filed on Aug. 14, 2018, in the Korean Intellectual Property Office, and entitled: "Semiconductor Device and Method of Manufacturing the Same," is incorporated by reference herein in its entirety.

BACKGROUND

1. Field

The present disclosure relates to a semiconductor device and a method of manufacturing the same.

2. Description of the Related Art

As demand for high performance, high speed, multifunctionalization and/or the like of semiconductor devices increases, the degree of integration of semiconductor devices also increases. Therefore, in manufacturing semiconductor devices, it is necessary to implement patterns having fine widths or fine spacing that correspond to the high integration of semiconductor devices. Further, to overcome the limitations of operating characteristics of planar metal oxide semiconductor FETs (MOSFETs) due to a reduction in the size thereof, efforts are being made to develop a semiconductor device including a FinFET having a three-dimensional structure channel.

SUMMARY

According to an aspect of the present disclosure, a semiconductor device may include a substrate having an active region, a gate structure disposed on the active region and including a gate dielectric layer and a gate electrode layer, and gate spacer layers disposed on both side surfaces of the gate structure and having an upper surface located on a level height lower than a level height of an upper surface of the gate electrode layer. The gate electrode layer has a shape in which an upper corner is rounded.

According to an aspect of the present disclosure, a semiconductor device may include a substrate having an active region and having a first region and a second region, a first gate electrode layer disposed on the first region to extend in a first direction and having a first length in a second direction, perpendicular to the first direction, and a second gate electrode layer disposed on the second region to extend in the first direction and having a second length greater than the first length in the second direction. The first gate electrode layer and the second gate electrode layer have a first thickness in an edge region provided in the second direction, and have a second thickness greater than the first thickness in a region located inwardly of the edge region.

According to an aspect of the present disclosure, a method of manufacturing a semiconductor device may include forming a gate electrode layer and gate spacer layers facing sidewalls of the gate electrode layer on a substrate having an active region, partially removing the gate spacer layers from upper surfaces, in such a manner that portions of side surfaces of the gate electrode layer are exposed, partially removing the gate electrode layer from an upper surface and the side surfaces exposed by the gate spacer layers, and forming a gate capping layer covering upper surfaces of the gate spacer layers and the gate electrode layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
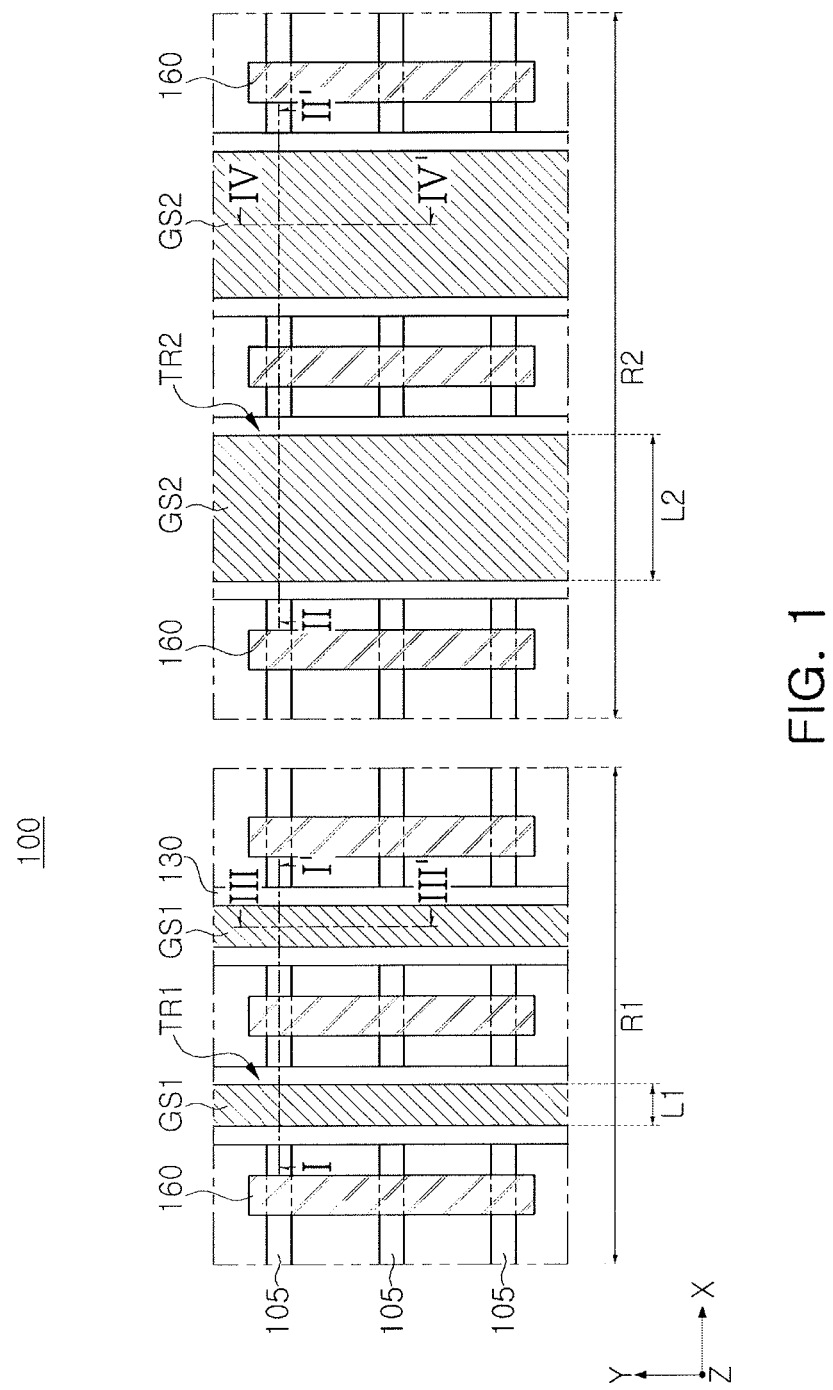
FIG. 1 illustrates a plan view of a semiconductor device according to example embodiments.

FIG. 1 is a plan view of a semiconductor device according to example embodiments. For convenience of explanation, only main components of the semiconductor device are illustrated in FIG. 1.

Figure 2A:
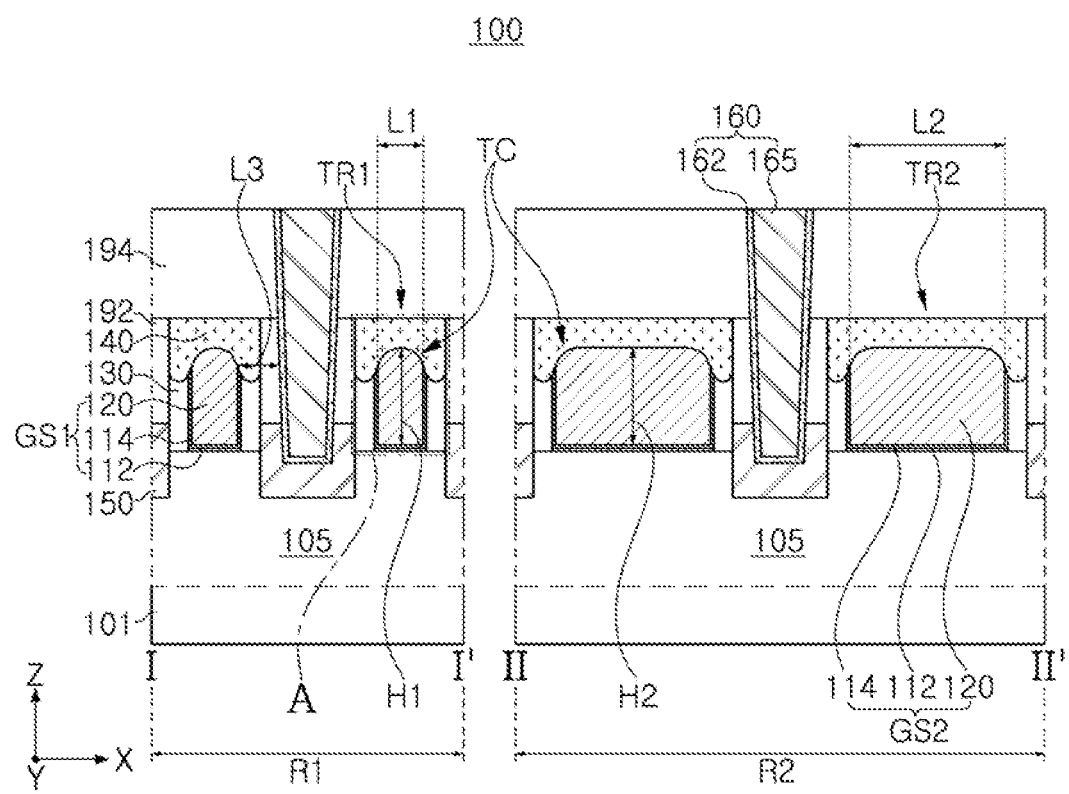
FIGS. 2A and 2B illustrate cross-sectional views of a semiconductor device according to example embodiments.
Figure 2B:
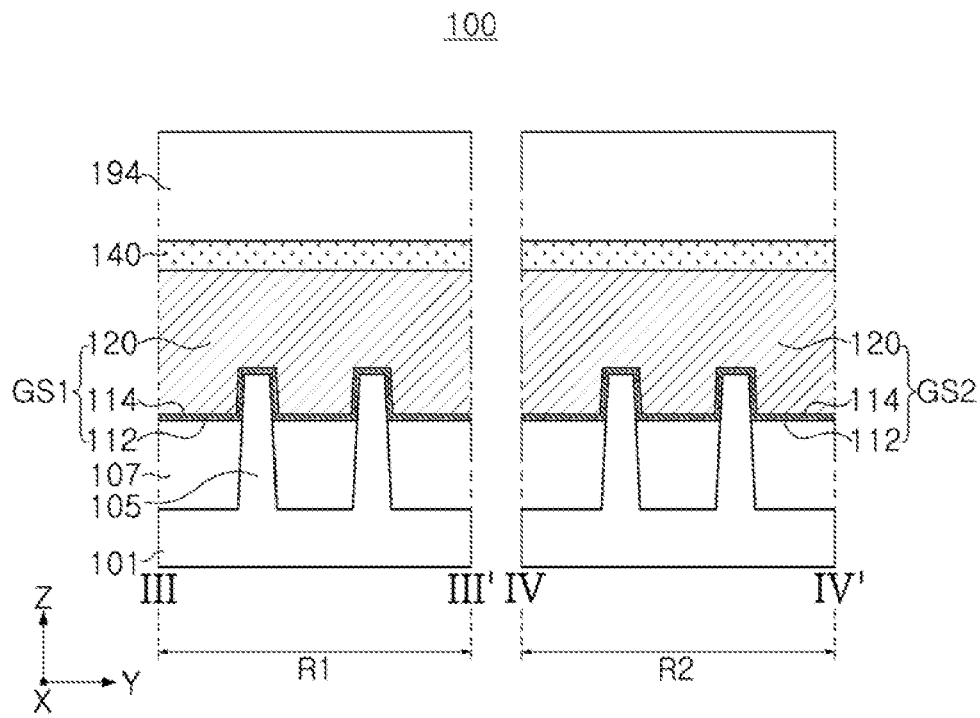

FIGS. 2A and 2B are cross-sectional views illustrating a semiconductor device according to example embodiments. FIG. 2A illustrates cross-sectional views along lines I-I' and II-II' in FIG. 1, and FIG. 2B illustrates cross-sectional views along lines III-III' and IV-IV' in FIG. 1.

Referring to FIGS. 1 to 2B, a semiconductor device 100 may include a substrate 101 having a first region R1 and a second region R2, active fins 105, first and second gate dielectric layers 112 and 114, gate electrode layers 120, gate spacer layers 130, gate capping layers 140, source/drain regions 150, and contact plugs 160. The semiconductor device 100 may further include device isolation layers 107 and first and second interlayer insulating layers 192 and 194.

The semiconductor device 100 may include FinFET devices, transistors in which the active fins 105 have a fin structure. The FinFET devices may include first and second transistors TR1 and TR2, positioned based on the active fins 105 and first and second gate structures GS1 and GS2, intersecting each other. The first and second transistors TR1 and TR2 may be n-type or p-type MOS field effect transistors (MOSFETs). The first and second transistors TR1 and TR2 may have different threshold voltages to have different operating voltages. For example, when the first and second transistors TR1 and TR2 are the same conductivity-type transistors, the first transistor TR1 may have a lower threshold voltage and a lower operating voltage than those of the second transistor TR2. According to an example embodiment, magnitudes of the threshold voltage and the operating voltage may be compared using absolute values thereof. The first and second transistors TR1 and TR2 may constitute the same or different circuits in the semiconductor device 100.

The substrate 101 may have different first and second regions R1 and R2, and the first and second regions R1 and R2 may be regions in which the first and second transistors TR1 and TR2 are disposed, respectively. The first and second regions R1 and R2 may be disposed to be spaced apart from each other or adjacently to each other in the semiconductor device 100.

The substrate 101 may have an upper surface extending in X and Y directions. The substrate 101 may include a semiconductor material, e.g., a Group IV semiconductor, a Group III-V compound semiconductor, or a Group II-VI compound semiconductor. For example, the Group IV semiconductor may include silicon, germanium or silicon-germanium. The substrate 101 may be provided as a bulk wafer, an epitaxial layer, a silicon-on-insulator (SOI) layer, a semiconductor-on-insulator (SeOI) layer, or the like.

The device isolation layers 107 may define the active fins 105 in the substrate 101, as illustrated in FIG. 2B. The device isolation layers 107 may be formed, e.g., by a shallow trench isolation (STI) process. According to example embodiments, the device isolation layers 107 may include a region extending into lower portions of the substrate 101 to be relatively deeper therein between adjacent active fins 105. According to example embodiments, the device isolation layers 107 may also have a curved upper surface having a level in a height direction, increased toward the active fins 105, and the forms of an upper surface and a lower surface of the device isolation layers 107 are not limited to the illustration of the drawings. The device isolation layers 107 may be formed of an insulating material. The device isolation layers 107 may be formed of, e.g., an oxide, a nitride, or a combination thereof.

The active fins 105 may be defined by the device isolation layers 107 in the substrate 101, and may be disposed to extend in one direction, e.g., the X direction. The active fins 105 may have a linear or bar shape. e.g., having a longitudinal direction extending in the X direction and, protruding from the substrate 101 to extend between the device isolation layers 107. Although FIG. 1 illustrates that three active fins 105 are spaced apart from each other in the Y direction in each of the first and second regions R1 and R2, the arrangement and number of the active fins 105 are not limited thereto. Further, the number of the active fins 105 constituting each of the first and second transistors TR1 and TR2 may be variously changed in example embodiments.

The active fins 105 may be formed of portions of the substrate 101, or may include an epitaxial layer grown from the substrate 101. The active fins 105 may be partially recessed in both sides of the first and second gate structures GS1 and GS2 and the gate spacer layers 130, and the source/drain regions 150 may be formed on the recessed active fins 105. Thus, as illustrated in FIG. 2A, the active fins 105 below the first and second gate structures GS1 and GS2 may have a relatively high height. In example embodiments, the active fins 105 may include impurities.

The first and second gate structures GS1 and GS2 may be disposed to extend in a direction, e.g., the Y direction, while intersecting the active fins 105 on the active fins 105. The first and second gate structures GS1 and GS2 may each include the first and second gate dielectric layers 112 and 114, and the gate electrode layers 120. The first and second gate structures GS1 and GS2 may have the same structure or may have different structures. For example, in the first and second gate structures GS1 and GS2, the first and second gate dielectric layers 112 and 114 may have different compositions and/or thicknesses, and configurations of the gate electrode layers 120 may be different from each other.

The first and second gate dielectric layers 112 and 114 may be disposed between the active fins 105 and the gate electrode layers 120. For example, as illustrated in FIG. 2A, the first gate dielectric layers 112 may be disposed on lower surfaces of the gate electrode layers 120, and the second gate dielectric layers 114 may be disposed to cover lower surfaces and side surfaces of the gate electrode layers 120, e.g., the first gate dielectric layer 112 may be only between the lower surface of the second gate dielectric layer 114 and the active fin 105. In another example, the second gate dielectric layers 114 may also only be disposed on lower surfaces of the gate electrode layers 120.

The second gate dielectric layers 114 may have upper ends located on a level height identical to or lower than a level height of upper surfaces of the gate electrode layers 120, on the side surfaces of the gate electrode layers 120. The upper ends of the second gate dielectric layers 114 may be located to be closer to upper surfaces of the gate spacer layers 130, rather than being close to an uppermost portion of the gate electrode layers 120 having a maximum height in a central region thereof. The upper ends of the second gate dielectric layers 114 may have a continuous profile with upper surfaces of the gate electrode layers 120. For example, the upper surfaces of the second gate dielectric layers 114 may form a substantially continuous curve with the upper surfaces of the gate electrode layers 120 without an inflection point, in a cross-sectional view. At the upper ends of the second gate dielectric layers 114, a height of an internal side surface of the second gate dielectric layer 114 in contact with the gate electrode layer 120 may be higher than a height of an external side surface thereof in contact with the gate spacer layers 130.

The first and second gate dielectric layers 112 and 114 may include different materials. The first gate dielectric layers 112 may be formed of a dielectric material, e.g., silicon oxide, silicon oxynitride, or a combination thereof. The second gate dielectric layers 114 may include a material having a dielectric constant higher than that of the first gate dielectric layers 112, and may include, e.g., an oxide, a nitride, or a high-k material. However, example embodiments thereof are not limited thereto. The high-k material may indicate a dielectric material having a dielectric constant higher than that of silicon oxide ($SiO_2$). The high-k material may be one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In example embodiments, the second gate dielectric layers 114 may also include an element serving to increase a threshold voltage of a transistor, e.g., a rare earth element, e.g., lanthanum (La), gadolinium (Gd), ruthenium (Lu), yttrium (Y), or scandium (Sc). These elements may serve to increase a threshold voltage by forming, e.g., an electric dipole.

Channel regions of the first and second transistors TR1 and TR2 may be formed in the active fins 105 intersecting the gate electrode layers 120. The gate electrode layers 120 may have first and second lengths L1 and L2 in a channel direction, e.g., in the X direction, in the first and second regions R1 and R2, respectively. The first and second lengths L1 and L2 may be identical to or correspond to channel lengths of the first and second transistors TR1 and TR2, respectively. The second length L2 may be greater than the first length L1. For example, the first length L1 may range from about 3 nm to about 100 nm, and the second length L2 may range from about 150 nm to about 1000 nm. The gate electrode layers 120 may have first and second maximum heights H1 and H2 along the Z direction in the first and second regions R1 and R2, respectively. The first and second maximum heights H1 and H2 may be substantially equal to each other, but are not limited thereto.

The gate electrode layers 120 may have upper rounded corners TC. In detail, as illustrated in FIG. 2A, the gate electrode layers 120 may have a shape in which corners on both sides in the X direction are rounded, e.g., top corners of each of the gate electrode layers 120 may be spaced apart from each other in the X direction and may be rounded. Thus, the gate electrode layers 120 may have a minimum thickness in edge regions in an extension direction thereof, e.g., in the Y direction. For example, the top corners TC of each of the gate electrode layers 120 may be, e.g., continuously, rounded, e.g., curved, along an entire length of the respective gate electrode layer 120 in the Y direction to have a reduced thickness, e.g., as measured along the X direction, at the top edge regions of the respective gate electrode layer 120.

As the gate electrode layers 120 have such a shape, i.e., reduced width in the X direction at the top edge regions, the gate electrode layers 120 may secure a separation distance L3 in the X direction. The separation distance L3 refers to a distance along the X direction from an outer side surface of the gate electrode layers 120, which is adjacent to the contact plug 160, to an outer side surface of the adjacent contact plug 160. Thus, even in a case in which a misalignment of the contact plug 160 and/or a height deviation of the gate electrode layers 120 occurs, an electrical short between the gate electrode layer 120 and the contact plug 160 may be prevented from occurring.

Upper surfaces of the gate electrode layers 120 may have an upwardly convex shape as a whole. The upper surfaces of the gate electrode layers 120 may have different profiles in the first and second gate structures GS1 and GS2. However, in example embodiments, the gate electrode layers 120 may have various shapes in a range in which both upper corners TC are not angular, but angles thereof are alleviated. The shape of the gate electrode layer 120 will be described below in more detail with reference to FIG. 3.

The gate electrode layers 120 may respectively be formed of a single layer, or may have a form in which a plurality of layers are stacked, according to example embodiments. The gate electrode layers 120 may include, e.g., TiN, TaN, W, WCN, TiAl, TiAlC, TiAlN, or combinations thereof, but are not necessarily formed of a metal material. In another example, the gate electrode layers 120 may be formed of a semiconductor material, e.g., polysilicon according to example embodiments.

The gate spacer layers 130 may be disposed on both sides of the first and second gate structures GS1 and GS2. The gate spacer layers 130 may isolate the source/drain regions 150 from the gate electrode layers 120. In the case of the gate spacer layers 130, internal side surfaces thereof facing the first and second gate structures GS1 and GS2 may be in contact with the second gate dielectric layers 114, and external side surfaces thereof may be in contact with the source/drain regions 150 and the first interlayer insulating layer 192. The gate spacer layers 130 may have a thickness, e.g., height along the Z direction, less than that of the gate electrode layers 120 relative to a bottom surface of the substrate 101. Upper surfaces of the gate spacer layers 130 may thus be located on a level height identical to or lower than that of upper surfaces of the gate electrode layers 120, and may be located on a level height lower than that of uppermost portions of the gate electrode layers 120. The upper surfaces of the gate spacer layers 130 may have a downwardly convex shape. Thus, the gate spacer layers 130 may have a lowest thickness in central regions thereof and a greatest thickness in edge regions thereof, in the X direction.

The gate spacer layers 130 may also be formed of a plurality of layers according to example embodiments. The gate spacer layers 130 may be formed of a low dielectric constant material, and may include at least one of, e.g., SiO, SiN, SiCN, SiOC, SiON, and SiOCN.

Figure 3:
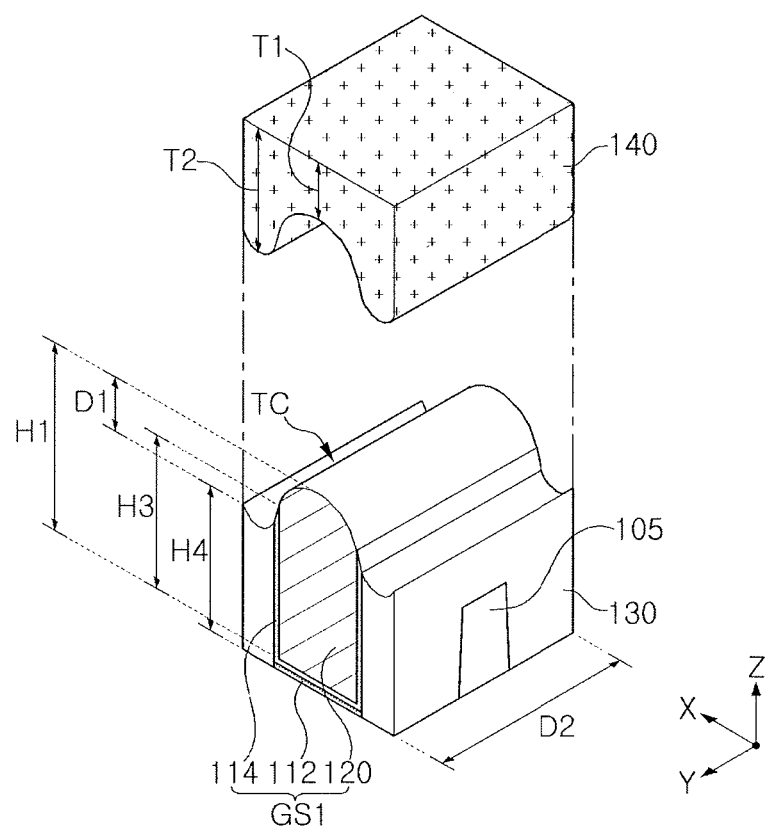
FIG. 3 illustrates a partially exploded perspective view of a portion of a semiconductor device according to example embodiments.

The gate capping layers 140 may be disposed to cover the upper surfaces of the gate electrode layers 120 and the gate spacer layers 130. Thus, lower surfaces of the gate capping layers 140 may have profiles along the upper surfaces of the gate electrode layers 120 and the gate spacer layers 130. The lower surfaces of the gate capping layers 140 may have a region recessed in a central region in the X direction, and may have downwardly-protruding regions in edge regions thereof. The upper surfaces of the gate capping layers 140 may be a flat surface, and the gate capping layers 140 may have a horseshoe shape as a whole, e.g., surrounding an upper surface and side surfaces of the gate electrode layer 120 (FIG. 3). Side surfaces of the gate capping layers 140 in the X direction may be coplanar with outer surfaces of the gate spacer layers 130. The gate capping layers 140 may be formed of, e.g., a silicon nitride, and in a case in which a composition of the gate capping layers 140 is different from that of the gate spacer layers 130, an interface therebetween may be recognized to be distinct. Alternatively, even in a case in which the composition of the gate capping layers 140 is similar to that of the gate spacer layers 130, the gate capping layers 140 and the gate spacer layers 130 may be formed by different processes, and physical properties thereof may thus be different, such that an interface therebetween may be distinct.

The source/drain regions 150 may be disposed on the active fins 105, on both sides of, e.g., each of, the first and second gate structures GS1 and GS2 with the corresponding gate spacer layers 130. The source/drain regions 150 may be provided as a source region or a drain region of the first and second transistors TR1 and TR2. The source/drain regions 150 may have an elevated source/drain structure in which upper surfaces thereof are positioned to be higher than a lower surface of the gate electrode layer 120, but are not limited thereto. The source/drain regions 150 may be connected to each other or may merge with each other, to be formed as a single source/drain region 150, on two or more active fins 105, but example embodiments are not limited thereto.

The source/drain regions 150 may be formed of an epitaxial layer, and may include impurities. For example, when the first and second transistors TR1 and TR2 are p-type transistors, the source/drain regions 150 may include p-type doped silicon germanium (SiGe). In another example, when the first and second transistors TR1 and TR2 are n-type transistors, the source/drain regions 150 may include n-type doped silicon (Si). In example embodiments, the source/drain regions 150 may include a plurality of regions including different concentrations of elements and/or doping elements.

The contact plugs 160 may penetrate through the first and second interlayer insulating layers 192 and 194 to be connected to the source/drain regions 150. The contact plugs 160 may be electrically connected to other components, e.g., wiring lines, such that signals may be applied to the source/drain regions 150. The contact plugs 160 may be formed to allow portions of the source/drain regions 150 to be recessed, to be connected to the source/drain regions 150, but example embodiments thereof are not limited thereto. The contact plugs 160 may have an elongated shape extending in the extension direction of the first and second gate structures GS1 and GS2, e.g., in the Y direction, and may have a shape of, e.g., a rectangle, an ellipse, or the like.

The contact plugs 160 may include a plug conductive layer 165 and a diffusion barrier layer 162 disposed on a lower surface and a side surface in contact with the source/drain region 150. The diffusion barrier layer 162 may be a layer formed as a portion of a material constituting the plug conductive layer 165, and is silicidized by the source/drain region 150. The contact plugs 160 may include a conductive material, e.g., titanium nitride (TiN), tantalum nitride (TaN), tungsten nitride (WN), aluminum (Al), copper (Cu), tungsten (W), molybdenum (Mo), or the like.

The first and second interlayer insulating layers 192 and 194 may be disposed to cover upper surfaces of the device isolation layers 107, the source/drain regions 150, and the gate capping layers 140. A height of the first interlayer insulating layer 192 may be substantially the same as a height of the gate capping layers 140. The first and second interlayer insulating layers 192 and 194 may be layers distinguished from each other in a process, and positions of relative heights and interfaces thereof are not limited to those illustrated in the drawings. In another example embodiment, the first and second interlayer insulating layers 192 and 194 may be formed of a single layer. The first and second interlayer insulating layers 192 and 194 may include at least one of, e.g., an oxide, a nitride, and an oxynitride, and may include a low dielectric constant material.

FIG. 3 is a partially exploded perspective view illustrating a portion of a semiconductor device according to example embodiments.

Referring to FIG. 3, the first gate structure GS1, the gate spacer layers 130, and the gate capping layer 140 of the semiconductor device 100 of FIGS. 1 to 2B are illustrated. The first gate structure GS1 may extend in one direction, e.g., in the Y direction, and the gate spacer layers 130 and the gate capping layer 140 may also extend in the Y direction along the first gate structure GS1.

In the first gate structure GS1, the gate electrode layer 120 may have a shape in which both upper corners TC, which are spaced apart from each other in the X direction, are rounded. The gate electrode layer 120 may be formed to have a thickness, i.e., height in the Z direction, that is greater than that of the gate spacer layers 130 on both sides of the gate electrode layer 120, so, e.g., a center of, the gate electrode layer 120 protrudes by a predetermined length D1 above the gate spacer layers 130. For example, as illustrated in FIG. 3, an uppermost point of, e.g., a center of, the gate electrode layer 120 protrudes by the length D1 above an uppermost point of the gate spacer layers 130.

In detail, the gate electrode layer 120 may have a first height H1, i.e., a maximum height along the Z direction in a central region thereof, and may have a third height H3, i.e., a minimum height along the Z direction at an edge region in contact with the gate spacer layer 130. The gate electrode layer 120 may have a region having a flat upper surface in at least a portion including the central region, but an example embodiment thereof is not limited thereto. The first gate structure GS1 may extend by a predetermined length D2 in the Y direction, and the extension length D2 may be variously changed according to example embodiments and the structure of the first transistor TR1.

The gate spacer layers 130 may be disposed to have a fourth height H4, i.e., a maximum height, on both sides of the first gate structure GS1. The fourth height H4 may be less than the first height H1, i.e., the maximum height of the gate electrode layer 120, and may be substantially the same as or less than the third height H3, i.e., the minimum height of the gate electrode layer 120.

The gate capping layer 140 may be disposed on the first gate structure GS1 and the gate spacer layers 130. The gate capping layer 140 may have a flat upper surface, and may have a curved lower surface, curved along the first gate structure GS1 and the gate spacer layers 130. The gate capping layer 140 may have a first thickness T1, i.e., a minimum thickness, on the gate electrode layer 120 corresponding to a central region of the gate capping layer 140, and may have a second thickness T2, i.e., a maximum thickness, on the gate spacer layers 130 corresponding to peripheral regions thereof.

Figure 4A:
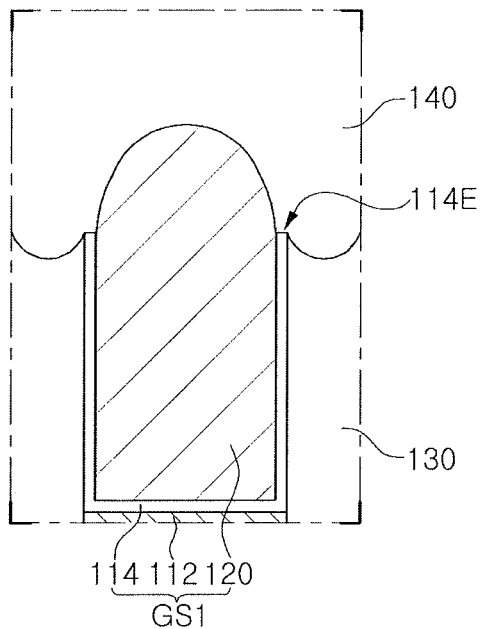
FIGS. 4A and 4B illustrate partially enlarged views of a portion of a semiconductor device according to example embodiments.
Figure 4B:
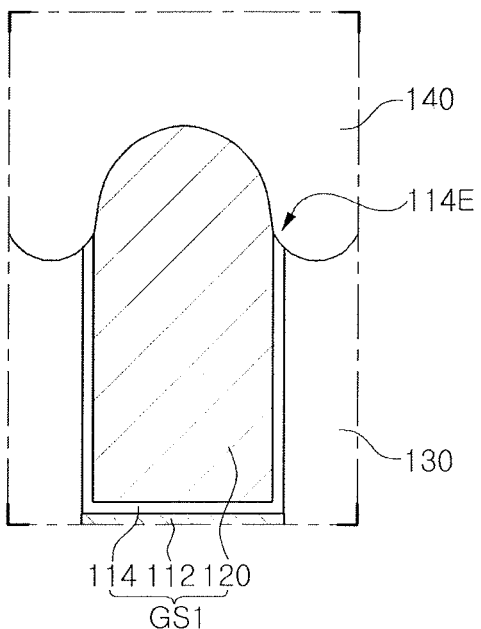

FIGS. 4A and 4B are partially enlarged views illustrating a portion of a semiconductor device according to other example embodiments. FIGS. 4A and 4B illustrate a region corresponding to region 'A' of FIG. 2A.

Referring to FIG. 4A, an upper end 114E of the second gate dielectric layer 114 in the first gate structure GS1 may have a flat upper surface between the gate electrode layer 120 and the gate spacer layers 130. Thus, in a manner different from the example embodiment of FIGS. 2A and 3, the upper end 114E of the second gate dielectric layer 114 may not have a continuous profile with the gate electrode layer 120. The upper end 114E of the second gate dielectric layer 114 may have a discontinuous profile with the gate electrode layer 120, in such a manner that a step may be formed at an interface thereof with the gate electrode layer 120. In addition, the upper end 114E of the second gate dielectric layer 114 may have a discontinuous profile with the gate spacer layers 130, and a step may be formed at an interface therebetween.

Referring to FIG. 4B, the upper end 114E of the second gate dielectric layer 114 in the first gate structure GS1 may not have a continuous profile with the gate electrode layer 120 differently from the example embodiment of FIGS. 2A and 3, and may have a continuous profile with the gate spacer layers 130.

As described above with reference to FIGS. 4A and 4B, the shape of upper ends of the second gate dielectric layer 114 in the first and second gate structures GS1 and GS2 may be variously modified according to example embodiments. Such a structure may be controlled by process conditions in process operations including a process to be described below with reference to FIG. 9H, a material of the second gate dielectric layer 114 and the gate electrode layer 120, an etching rate of the gate dielectric layer 114, a relative etching rate thereof with respect to the gate electrode layer 120, or the like.

Figure 5:
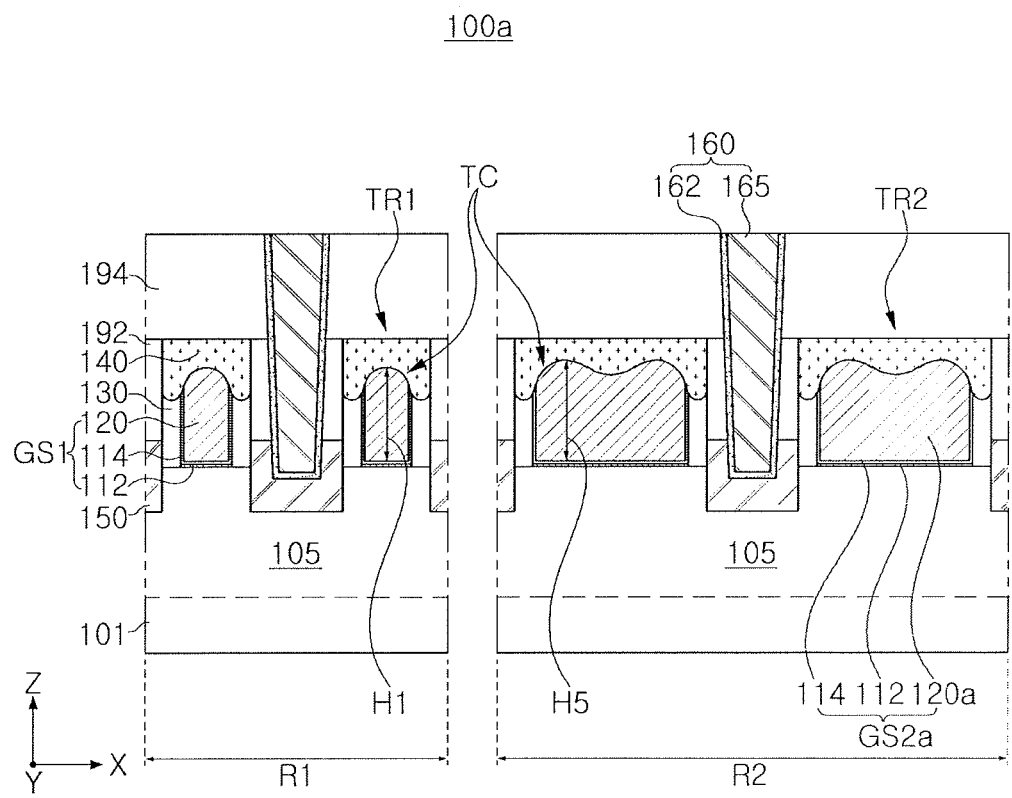
FIGS. 5 and 6 illustrate cross-sectional views of a semiconductor device according to example embodiments.
Figure 6:
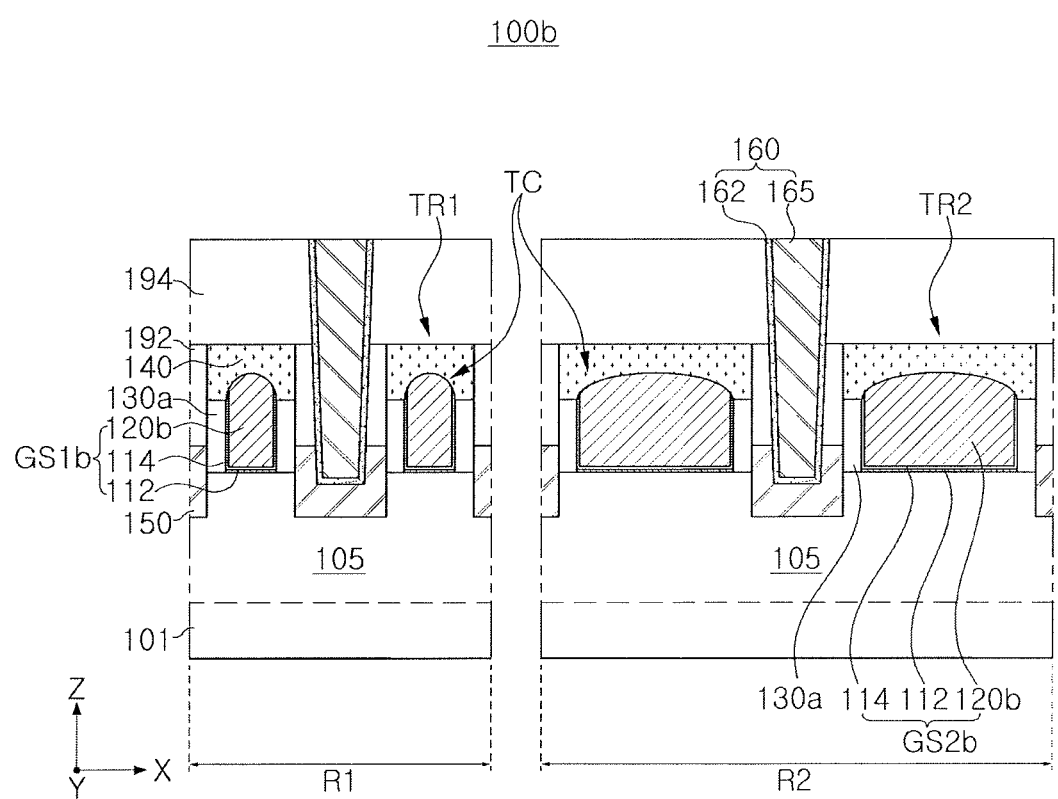

FIGS. 5 and 6 are cross-sectional views illustrating a semiconductor device according to other example embodiments. FIGS. 5 and 6 illustrate cross sections corresponding to FIG. 2A.

Referring to FIG. 5, in a semiconductor device 100a, upper surfaces of gate electrode layers 120a constituting second gate structures GS2a may respectively have two or more curves. A maximum height H5 of each of the gate electrode layers 120a of the second gate structures GS2a may be higher than a maximum height H1 of each of the gate electrode layers 120 of first gate structures GS1.

The upper surfaces of the gate electrode layers 120a may have a shape having two or more curves, depending on the range of a length in the X direction. This shape may be obtained by controlling the flow of an etchant according to process conditions during a process of removing a portion of the gate electrode layers 120a to be described below with reference to FIG. 9H. In this case, the upper corners TC of the gate electrode layers 120a may also have an upwardly convex shape, and the gate electrode layers 120a may have a minimum thickness in a region in contact with the gate spacer layers 130.

In the example embodiment, the maximum height H5 of the gate electrode layers 120a in the second gate structures GS2a may be different from the maximum height H1 of the gate electrode layers 120 in the first gate structures GS1. The gate electrode layers 120a of the second gate structures GS2a may have a relatively great length, and may thus have the extent influenced due to the etchant from the side during the removal process of the gate electrode layers 120a, different from the extent of an influence in the first gate structures GS1. The maximum height H5 of the gate electrode layers 120a in the second gate structures GS2a may be higher than the maximum height H1 of the gate electrode layers 120 in the first gate structures GS1. A difference in the heights may be variously changed according to lengths of the gate electrode layers 120 and 120a, a height of the gate spacer layers 130, process conditions, or the like. In addition, the height difference and the shapes of the upper surfaces of the gate electrode layers 120a are not necessarily related to each other, and may be independently applied to the example embodiments described above with reference to FIGS. 2A to 4.

Referring to FIG. 6, in a semiconductor device 100b, gate spacer layers 130a may have a flat upper surface, and gate electrode layers 120b of first and second gate structures GS1b and GS2b may have an upper surface more convex than a shape in the semiconductor device 100 of FIG. 2A.

The gate spacer layers 130a may be formed to have a flat upper surface depending on a width in an X direction, a height, process conditions, or the like. In this case, the gate spacer layers 130a may also be disposed to be lower than the gate electrode layers 120b. In addition, upper surfaces of the gate electrode layers 120b may have an upwardly convex shape to only have a maximum height in a central region thereof without a flat region. However, the shapes of the gate spacer layers 130a and the upper surfaces of the gate electrode layers 120b are not related to each other, and may be respectively applied to the example embodiments described above with reference to FIGS. 2A to 5.

Figure 7:
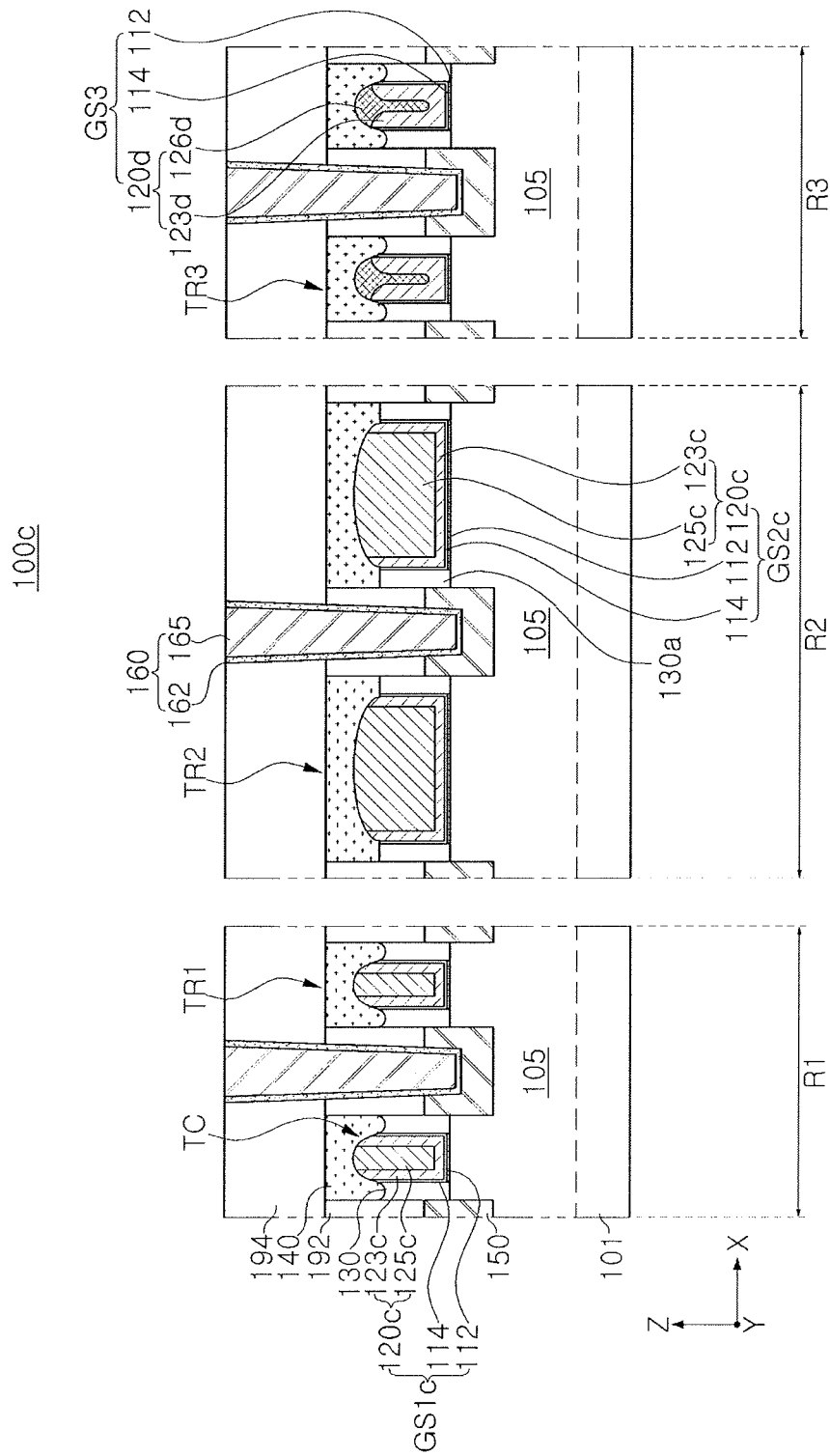
FIG. 7 illustrates a cross-sectional view of a semiconductor device according to example embodiments.

FIG. 7 is a cross-sectional view illustrating a semiconductor device according to other example embodiments.

Referring to FIG. 7, in a semiconductor device 100c, the substrate 101 may have a third region R3 in addition to the first and second regions R1 and R2. Third transistors TR3 including third gate structures GS3 may be disposed in the third region R3. Further, in first and second gate structures GS and GS2c, gate electrode layers 120c may include first and second conductive layers 123c and 125c. In first to third transistors TR1, TR2 and TR3, upper corners TC of gate electrode layers 120c and 120d may have a curved shape.

The third transistors TR3 may have the same channel length as the first transistors TR1, and may have different threshold voltages or operating voltages. For example, the first transistors TR1 may be n-type transistors, and the third transistors TR3 may be p-type transistors. In this case, in the first and third regions R1 and R3, active fins 105 may include different conductivity-type impurities.

In the first and second gate structures GS1c and GS2c, first and second conductive layers 123c and 125c of the gate electrode layers 120c may include different materials. For example, the first conductive layers 123c may function to control a work function, and may include, e.g., TiN, Ta, TaN, TiAl, TiAlC, TiAlN, or combinations thereof. The second conductive layers 125c may include, e.g., TiN, W, WCN, or combinations thereof.

In the third gate structures GS3, the gate electrode layer 120d may include first and second conductive layers 123d and 126d. For example, the first conductive layers 123d may be formed of the same material as that of the first conductive layers 123c of the first and second gate structures GS1c and GS2c, and the second conductive layers 126d may be formed of a material different from that of the second conductive layers 125c of the first and second gate structures GS1c and GS2c. In addition, the second conductive layers 126d may have a shape having a relatively wide width in an upper portion and a relatively thin and elongated extension in a lower portion. Such a structure may be obtained depending on relative thicknesses of the first and second conductive layers 123d and 126d, the size of the third gate structures GS3, or the like, in a process of forming the gate electrode layer 120d to be described below with reference to FIG. 9F.

As described above, in the example embodiments, the semiconductor device 100c may include a plurality of transistors TR1, TR2 and TR3 having different threshold voltages. In the respective transistors TR1, TR2 and TR3, the number, material, structure, and the like of the conductive layers 123c, 123d, 125c and 126d, constituting gate electrode layers 120c and 120d, may be variously changed. Although the example embodiment illustrates that the gate electrode layers 120c and 120d have the rounded upper corners TC by way of example, an example embodiment thereof is not limited thereto. For example, a portion of the gate electrode layers 120c and 120d of the first to third transistors TR1, TR2 and TR3 may also have substantially right-angular upper corners, and other portions thereof may have rounded upper corners TC.

Figure 8:
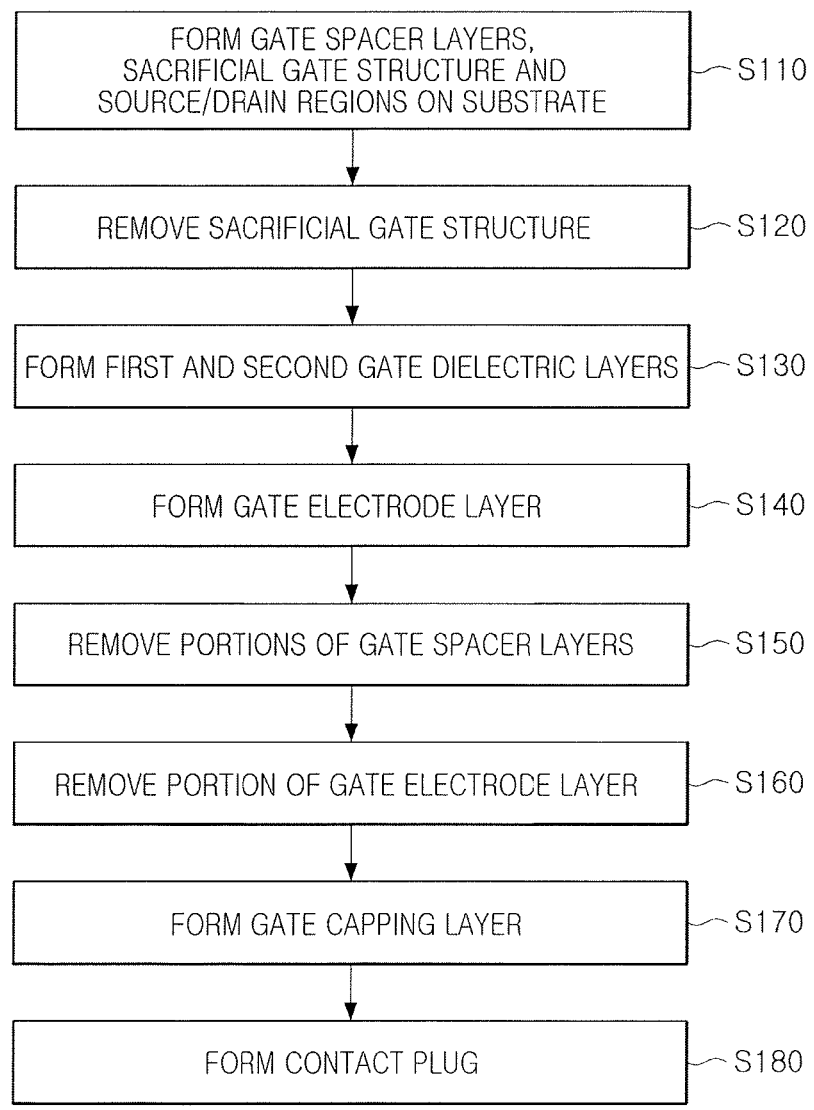
FIG. 8 illustrates a flowchart of a method of manufacturing a semiconductor device according to example embodiments.

FIG. 8 is a flowchart illustrating a method of manufacturing a semiconductor device according to example embodiments. FIGS. 9A to 9J are views illustrating stages in a method of manufacturing a semiconductor device according to example embodiments. FIGS. 9A to 9J illustrate regions corresponding to FIG. 2A.

Figure 9A:
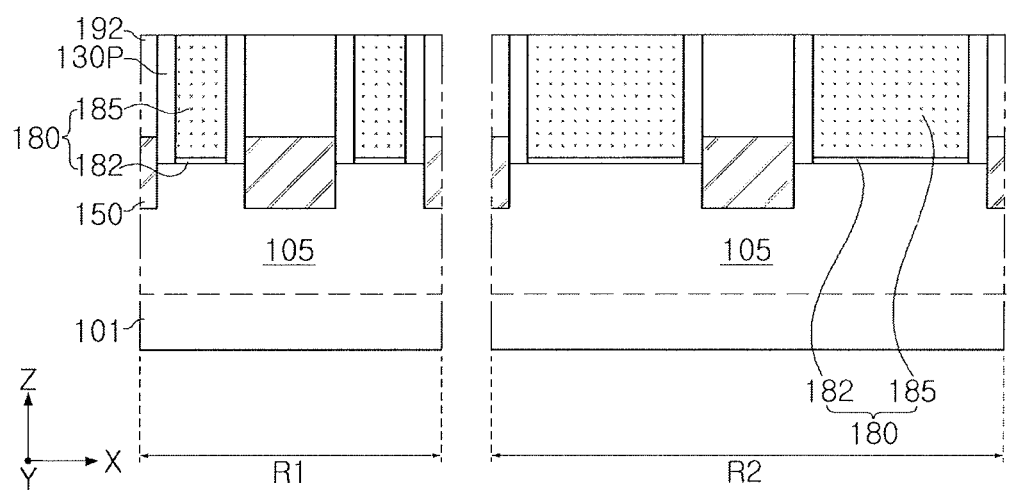
FIGS. 9A to 9J illustrate cross-sectional views of stages in a method of manufacturing a semiconductor device according to example embodiments.

Referring to FIGS. 8 and 9A, the active fins 105 may be formed by patterning the substrate 101 having the first and second regions R1 and R2, and a sacrificial gate structure 180 and source/drain regions 150 may be formed, in operation S110. Further, in the present operation, gate spacer layers 130P and the first interlayer insulating layer 192 may also be formed.

The first and second regions R1 and R2 may respectively be transistor regions, and the substrate 101 may include a conductive region, e.g., well structures doped with impurities. The active fins 105 may be defined by forming the device isolation layers 107 (see FIG. 2B), and may have a shape protruding from the substrate 101. The active fins 105 may include impurity regions.

The sacrificial gate structure 180 may be formed in a region in which the first and second gate dielectric layers 112 and 114, gate electrode layers 120, and gate capping layers 140 are disposed, through a subsequent process, as illustrated in FIG. 2A. Each of the sacrificial gate structures 180 may include a sacrificial gate insulating layer 182 and a sacrificial gate electrode layer 185. The sacrificial gate structure 180 may be formed to further include a sacrificial gate capping layer disposed on the sacrificial gate electrode layer 185. The sacrificial gate capping layer may be removed by a planarization process performed in forming the first interlayer insulating layer 192 and thus may not remain. The sacrificial gate insulating layer 182 may be an insulating layer, and the sacrificial gate electrode layer 185 may be a conductive layer, but are not limited thereto. For example, the sacrificial gate insulating layer 182 may include, e.g., silicon oxide, and the sacrificial gate electrode layer 185 may include, e.g., polysilicon.

The gate spacer layers 130P may be formed on both sidewalls of the sacrificial gate structure 180. The gate spacer layers 130P are in a state before the gate spacer layers 130 have a final shape as illustrated in FIG. 2A, and are thus denoted by reference numeral 130P different from the reference numeral 130. The gate spacer layers 130P may be formed to have a top portion narrowed at the time of formation thereof, and then, the top portion may be removed in a planarization process performed at the time of forming the first interlayer insulating layer 192. Thus, the gate spacer layers 130P may have a flat upper surface as illustrated in the drawing.

The source/drain regions 150 may be formed on the active fins 105 recessed after removing a portion of the active fins 105 on both sides of the gate spacer layers 130. The source/drain regions 150 may be formed using, e.g., a selective epitaxial growth (SEG) process. The source/drain regions 150 may include a semiconductor material doped with impurities, e.g., Si, SiGe or SiC. In detail, the source/drain regions 150 may include n-type or p-type impurities. The impurities may be doped in-situ during the formation of the source/drain regions 150, or may be implanted separately after growth of the source/drain regions. The source/drain regions 150 may be grown along a crystallographically stable plane during a growth process, to have a cross section having, e.g., a pentagonal, hexagonal or shape similar thereto, in the Y direction, but example embodiments thereof are not limited thereto.

The first interlayer insulating layer 192 may be formed by depositing an insulating material to cover the sacrificial gate structure 180 and the source/drain regions 150 and then exposing an upper surface of the sacrificial gate electrode layer 185 through a planarization process. The first interlayer insulating layer 192 may include at least one of, e.g., an oxide, a nitride, and an oxynitride, and may include a low dielectric constant material.

Figure 9B:
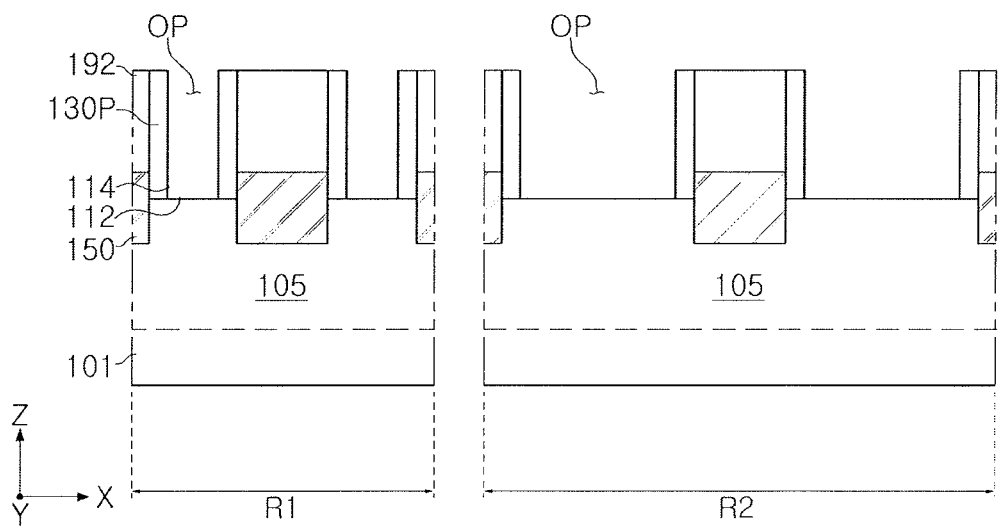

Referring to FIGS. 8 and 9B, the sacrificial gate structure 180 may be removed, thereby forming openings OP, in operation S120.

The sacrificial gate structure 180 may be selectively removed with respect to the lower device isolation layer 107, the active fins 105, and the gate spacer layers 130P, to form the openings OP exposing the device isolation layer 107, the active fins 105, and the gate spacer layers 130P. The removal process of the sacrificial gate structure 180 may be performed using at least one of a dry etching process and a wet etching process.

Figure 9C:
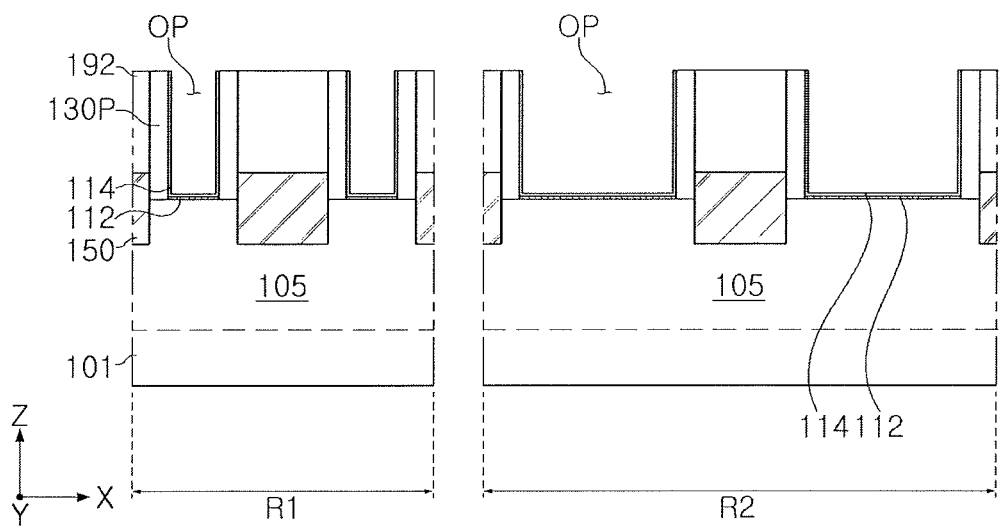

Referring to FIGS. 8 and 9C, the first and second gate dielectric layers 112 and 114 may be formed in the openings OP in S130. The first and second gate dielectric layers 112 and 114 may be formed to have substantially the same thickness in the first and second regions R1 and R2. The first gate dielectric layer 112 may be formed on upper surfaces of the active fins 105, exposed to lower surfaces of the openings OP. According to example embodiments, the first gate dielectric layer 112 may also be formed by oxidizing a portion of the active fins 105. The second gate dielectric layers 114 may be formed substantially conformally along sidewalls and lower surfaces of the openings OP. A formation process of the first gate dielectric layer 112 and a formation process of the second gate dielectric layer 114 may be performed separately. The first and second gate dielectric layers 112 and 114 may be formed using, e.g., an atomic layer deposition (ALD), chemical vapor deposition (CVD), or physical vapor deposition (PVD) process. The first and second gate dielectric layers 112 and 114 may include, e.g., oxide, nitride or a high-k material.

Figure 9D:
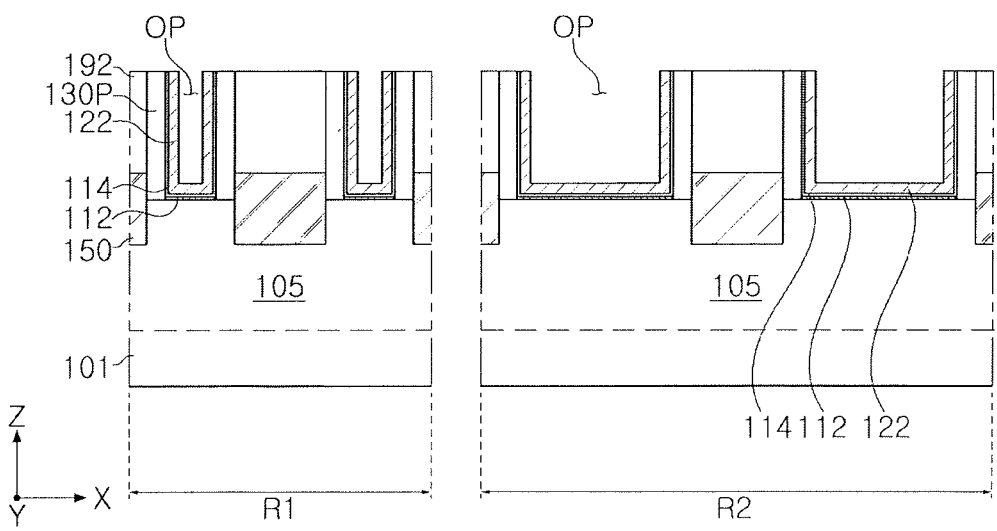
Figure 9E:
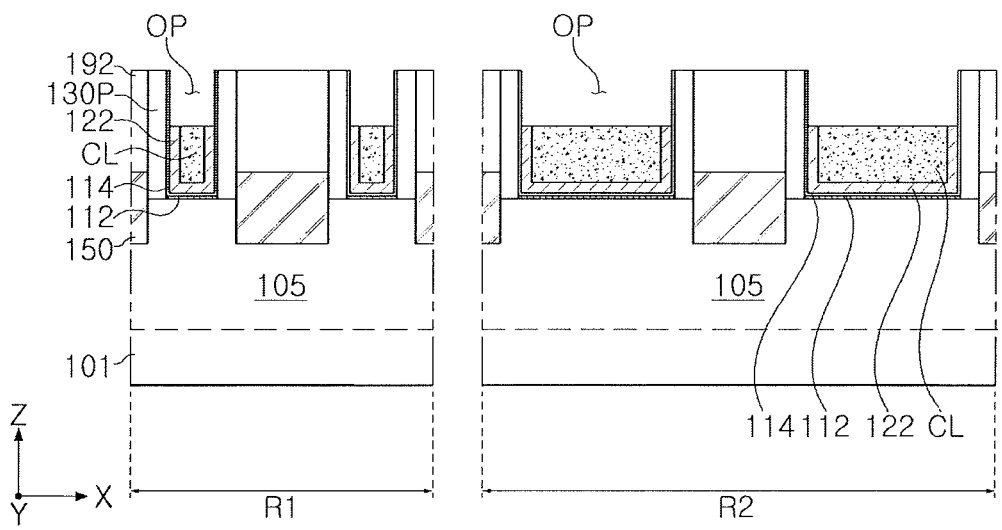
Figure 9F:
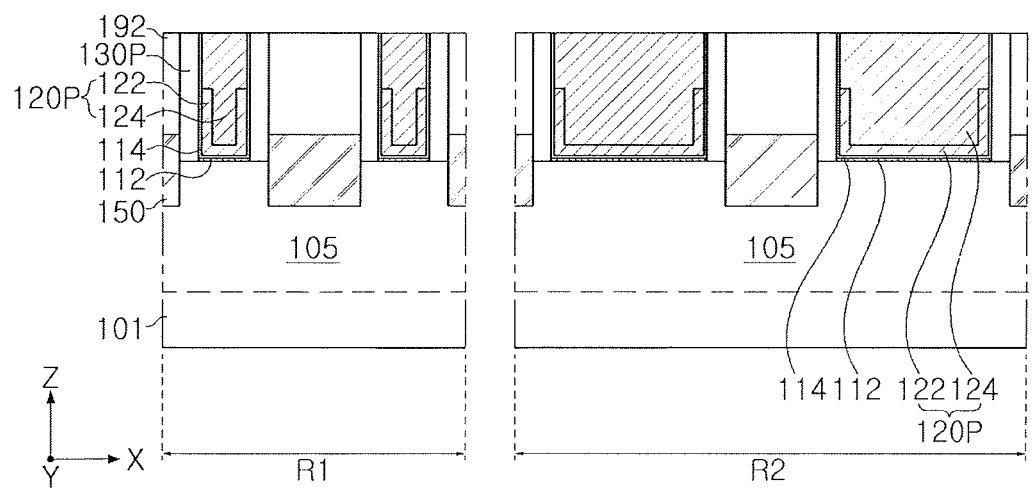

Next, forming a gate electrode layer 120P in operation S140 will be described with reference to FIGS. 8 and 9D to 9F. FIGS. 9D to 9F illustrate a manufacturing method in a case in which the gate electrode layer 120P (see FIG. 9F) is formed of a plurality of conductive layers, by way of example.

Referring to FIG. 9D, a first layer 122 forming the gate electrode layer 120P may be formed in the openings OP.

The first layer 122 may be a layer forming a portion of the gate electrode layer 120P through a subsequent process. For example, when the gate electrode layer 120P includes a plurality of conductive layers, the first layer 122 may include at least one layer formed in a lower portion, among the plurality of conductive layers. For example, in the case of the semiconductor device 100c of FIG. 7, the first conductive layer 123d may be formed in this operation. The first layer 122 may be conformally formed on the second gate dielectric layer 114 in the opening OP.

Referring to FIG. 9E, the first layer 122 may be partially removed in the openings OP.

First, a coating layer CL may be formed on the first layer 122, to fill a lower portion of the opening OP to a predetermined height. The coating layer CL may include a carbonaceous material, and, e.g., may be formed of an amorphous carbon layer (ACL) or a carbon-based spin-on hardmask (C-SOH) layer.

Next, the first layer 122 on the coating layer CL in the openings OP may be removed to a predetermined depth. The depth may range, e.g., from about 20% to about 70% of an overall depth of the opening OP. A lower portion of the first layer 122, covered by the coating layer CL, may not be removed. By removing the upper region of the first layer 122, a space for gap-fill of a second layer 124 (see FIG. 9F) formed subsequently may be secured.

During the process of removing a portion of the first layer 122, the first and second gate dielectric layers 112 and 114 may remain without being removed, but example embodiments thereof are not limited thereto. According to example embodiments, in this operation, the second gate dielectric layer 114 above the coating layer CL may also be removed together. In this case, in an ultimately obtained structure, the second gate dielectric layer 114 may be disposed to have a relatively low height on a side of the gate electrode layer 120.

After the removal process of removing a portion of the first layer 122, the coating layer CL may be removed. The coating layer CL may be removed, e.g., by an ashing or stripping process.

Referring to FIG. 9F, a second layer 124 may be formed to constitute the gate electrode layer 120P in the openings OP.

The second layer 124 may be a layer constituting a portion of the gate electrode layer 120P. For example, when the gate electrode layer 120P includes a plurality of conductive layers, the second layer 124 may be a layer excluding the layer formed in the operation described above with reference to FIG. 9D. For example, in the case of the semiconductor device 100c of FIG. 7, the second conductive layer 126d may be formed in this operation. The second layer 124 may be formed to entirely fill the opening OP. The second layer 124 may be formed of the same material as or a material different from that of the first layer 122, and in the case in which the second layer 124 is formed of the same material as that of the first layer 122, an interface between the first and second layers may be indistinguishable.

After depositing the material forming the second layer 124, the material forming the second layer 124 may be removed from an upper surface of the first interlayer insulating layer 192. The removal process may be performed using a planarization process such as chemical mechanical polishing (CMP). Thus, the gate electrode layer 120P including the first and second layers 122 and 124 may be formed. Since the gate electrode layer 120P is in a state before having an ultimately obtained form as illustrated in FIG. 2A, the gate electrode layer 120P is denoted by reference numeral 120P, different from the reference numeral of FIG. 2A. Hereinafter, the gate electrode layer 120P may be illustrated as a single layer.

In example embodiments, for example, when the gate electrode layer 120P is formed of a single layer, the gate electrode layer 120P may be formed by depositing a conductive material to fill the openings OP in the operation described above with reference to FIG. 9D. In addition, even when the gate electrode layer 120P is formed of a plurality of layers, in the case in which the plurality of layers are sequentially stacked, conductive materials may be sequentially deposited to fill the openings OP in the operation described above with reference to FIG. 9D, thereby forming the gate electrode layer 120P.

Figure 9G:
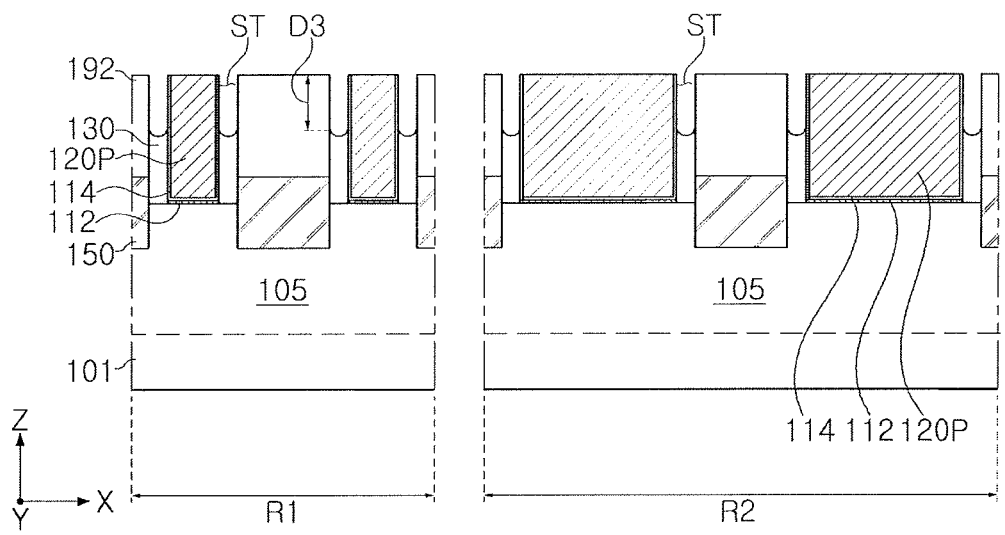

Referring to FIGS. 8 and 9G, portions of the gate spacer layers 130P may be removed in operation S150.

The gate spacer layers 130P may be selectively removed with respect to the first interlayer insulating layer 192 and the gate electrode layer 120P. The gate spacer layer 130P may be recessed to a predetermined depth D3 from an exposed upper portion, using a dry etching or wet etching process. The depth D3 may be determined to be a depth at which the gate spacer layer 130 remains at the same height as or a height lower than an ultimate height of the required gate electrode layer 120 in consideration of an ultimate height of a required gate electrode layer 120. A tunnel portion ST may be formed in a region from which the gate spacer layer 130P has been removed. The tunnel portion ST may have a shape extending in the Y direction. For example, when a portion of the gate spacer layer 130P is removed, in a case in which a relatively large amount of etching is performed in a central region of the gate spacer layer 130P, the gate spacer layer 130 may have a concave region on an upper surface, but example embodiments thereof are not limited thereto.

In this operation, the second gate dielectric layer 114 on the side of the gate electrode layer 120P may be removed together or may remain without being removed. For example, the case of the example embodiment of FIG. 4B may correspond to a structure formed by removing the second gate dielectric layer 114 together with a portion of the gate spacer layer 130P in this operation.

Figure 9H:
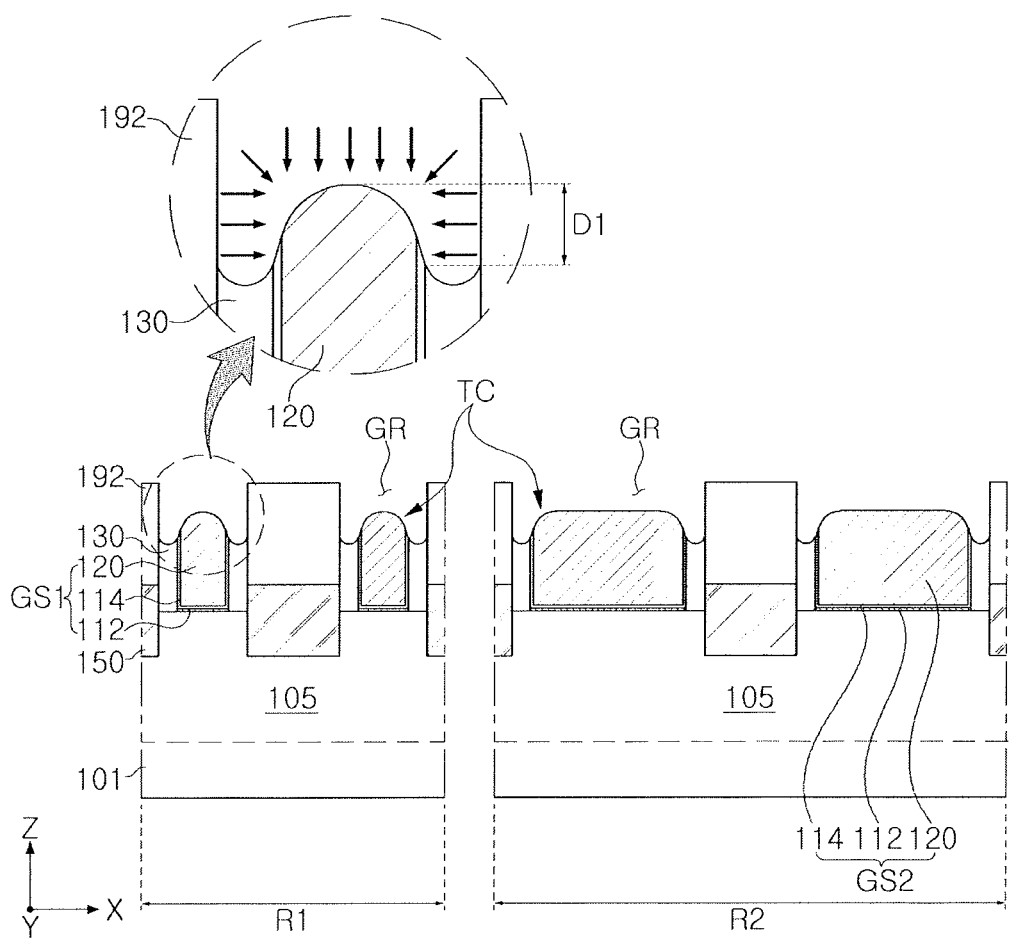

Referring to FIGS. 8 and 9H, a portion of the gate electrode layer 120P may be removed in operation S160.

The gate electrode layer 120P may be selectively recessed with respect to the first interlayer insulating layer 192 and the gate spacer layer 130. A recessed region GR may be formed in a region in which the gate electrode layer 120P has been removed. The gate electrode layer 120P may be etched from an exposed upper surface and an exposed side surface. In the etching process, as shown by arrows in an enlarged view of FIG. 9H, since an etchant is supplied, e.g., introduced, from the side surface through the tunnel portion ST as well as the upper surface, an etching amount in the corner region may be relatively large. Thus, when the gate electrode layer 120P is removed under appropriate conditions, e.g., by an isotropic etching process condition without applying bias or by applying significantly-reduced bias thereto, the gate electrode layer 120 may be formed to have the rounded corner TC.

In this operation, the second gate dielectric layer 114 on the side of the gate electrode layer 120P may be removed together with a portion of the gate electrode layer 120P. If the upper portion of the first layer 122 constituting the gate electrode layer 120P is left without being completely removed in the process described above with reference to FIG. 9E, the etching may be performed from the side surface in this operation, thereby removing the entire upper portion of the first layer 122.

By this operation, the first and second gate structures GS1 and GS2 including the first and second gate dielectric layers 112 and 114 and the gate electrode layer 120 may be formed. Ultimately, the gate electrode layer 120 may be formed to protrude upwardly of the gate spacer layer 130 by a predetermined length.

Figure 9I:
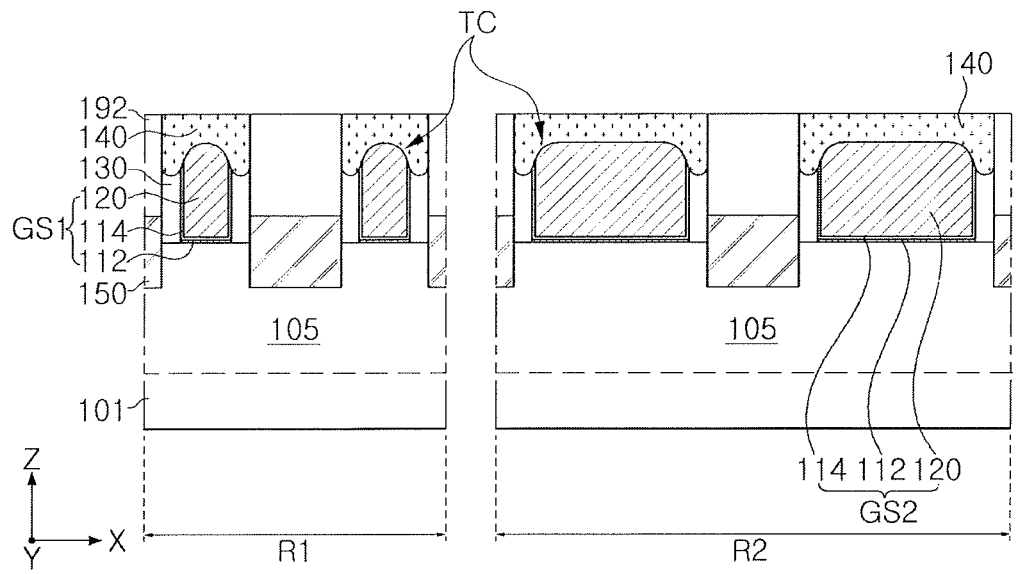

Referring to FIGS. 8 and 9I, the gate capping layer 140 may be formed on the gate electrode layer 120, in operation S170.

The gate capping layer 140 may be formed to fill the recessed region GR while covering the upper surfaces of the gate electrode layer 120 and the gate spacer layer 130. After a material forming the gate capping layer 140 is deposited, a planarization process may be performed. Thus, the gate capping layer 140 may be formed to fill a space between the adjacent first interlayer insulating layers 192 and to have a flat upper surface. The gate capping layer 140 may be formed of, e.g., SiN. As the gate capping layer 140 may have a process procedure different from that of the gate spacer layer 130, an interface between the gate capping layer 140 and the gate spacer layer 130 may be distinct even in a case in which compositions thereof are similar.

Figure 9J:
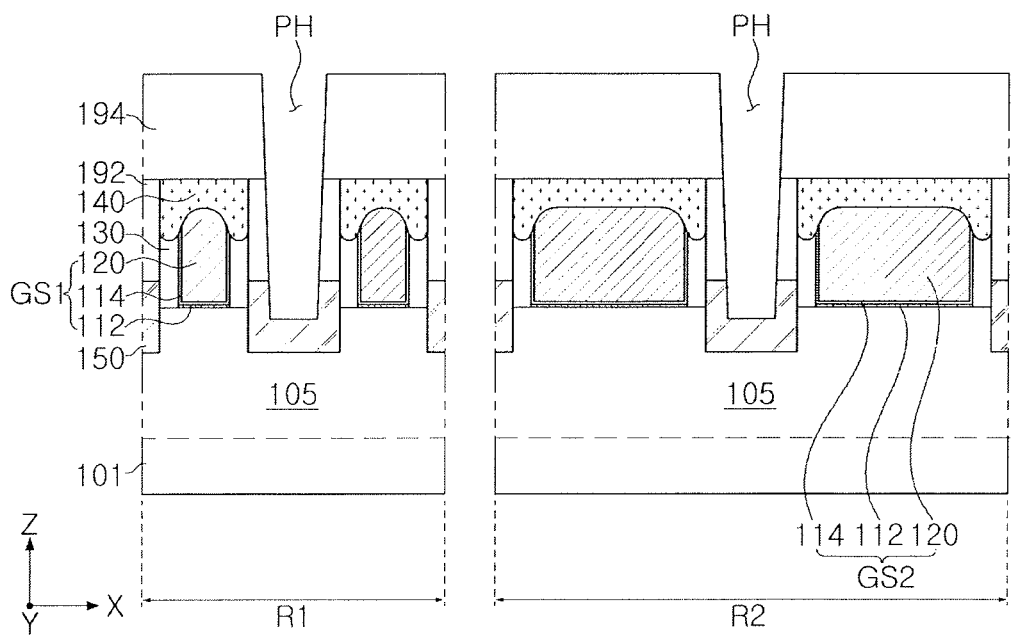

Referring to FIGS. 8 and 9J, a contact hole PH may be formed to expose the source/drain region 150, in S180.

First, the second interlayer insulating layer 194 may be formed on the gate capping layer 140 and the first interlayer insulating layer 192. The contact hole PH may be formed by removing the first and second interlayer insulating layers 192 and 194 to expose the source/drain region 150. The contact hole PH may have an inclined side surface on an upper surface of the substrate 101, depending on an aspect ratio. Referring to FIG. 2A together, conductive materials may be sequentially deposited in the contact hole PH to form the contact plugs 160 including the diffusion barrier layer 162 and the plug conductive layer 165.

If the contact plugs 160 are formed to be adjacent to the first and second gate structures GS1 and GS2, the contact plugs 160 may be brought into contact with side surfaces of the gate electrode layer 120 adjacent thereto if misalignment occurs. In this case, a defect, e.g., an electrical short, may occur. However, in example embodiments, since the upper portion of the gate electrode layer 120 has rounded corners, such defects may be prevented.

Figure 10:
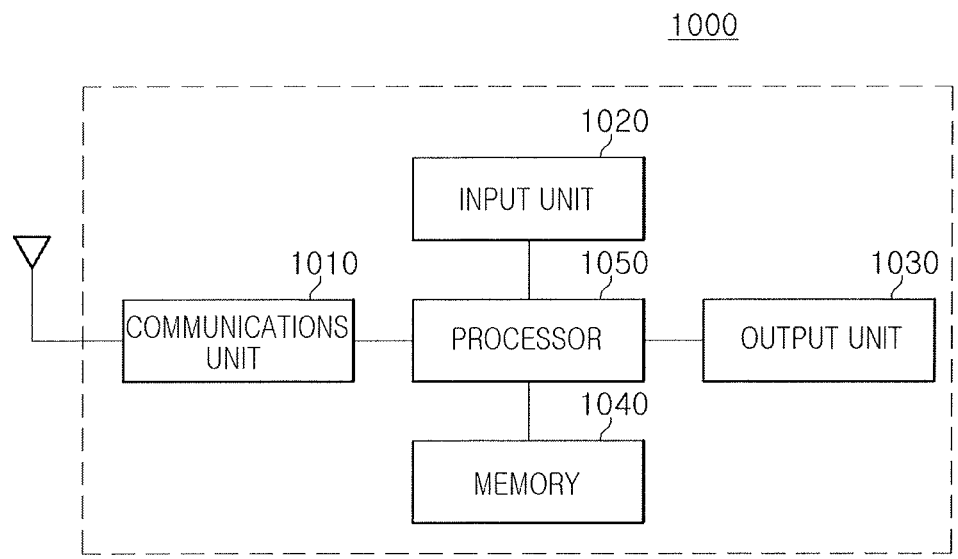
FIG. 10 illustrates a block diagram of an electronic apparatus including a semiconductor device according to example embodiments.

FIG. 10 is a block diagram illustrating an electronic apparatus including a semiconductor device according to example embodiments.

With reference to FIG. 10, an electronic device 1000 according to an example embodiment may include a communications unit 1010, an input unit 1020, an output unit 1030, a memory 1040, and a processor 1050.

The communications unit 1010 may include a wired/wireless communications module, and may include a wireless Internet module, a near-field communications module, a global positioning system (GPS) module, a mobile communications module, or the like. The wired/wireless communications module included in the communications unit 1010 may be connected to an external communications network by various communications protocols to transmit and receive data.

The input unit 1020 may include a mechanical switch, a touchscreen, a voice recognition module, or the like, as a module allowing a user to control an operation of the electronic device 1000. In addition, the input unit 1020 may also include a mouse operated using a track ball, laser pointer scheme or the like, or may include a finger mouse device. Further, the input unit 1020 may further include various sensor modules through which data is input by a user.

The output unit 1030 may output information processed by the electronic device 1000, in the form of voice or image, and the memory 1040 may store a program for processing and control of the processor 1050, data, or the like. The processor 1050 may transfer a command to the memory 1040 according to a necessary operation to thus store data or retrieve the data therefrom.

The memory 1040 may communicate with the processor 1050 through an interface embedded in the electronic device 1000 or through a separate interface. For example, when the memory 1040 communicates with the processor 1050 through a separate interface, the processor 1050 may store data in or retrieve data from the memory 2040 through various interface standards, e.g., secure digital (SD), secure digital high capacity (SDHC), secure digital extended capacity (SDXC), MICRO SD, universal serial bus (USB), or the like.

The processor 1050 may control operations of respective parts included in the electronic device 1000. The processor 1050 may perform controlling and processing of data relevant to voice communications, videotelephony, data communications, or the like, or relevant to multimedia reproduction and management. In addition, the processor 1050 may process an input by a user through the input unit 1020 and may output the processed results through the output unit 1030. Further, the processor 1050 may store data necessary for controlling operations of the electronic device 1000 in the memory 1040 or may retrieve data from the memory 1040. At least one of the processor 1050 and the memory 1040 may include a semiconductor device according to various example embodiments as described above with reference to FIGS. 1 to 7.

Figure 11:
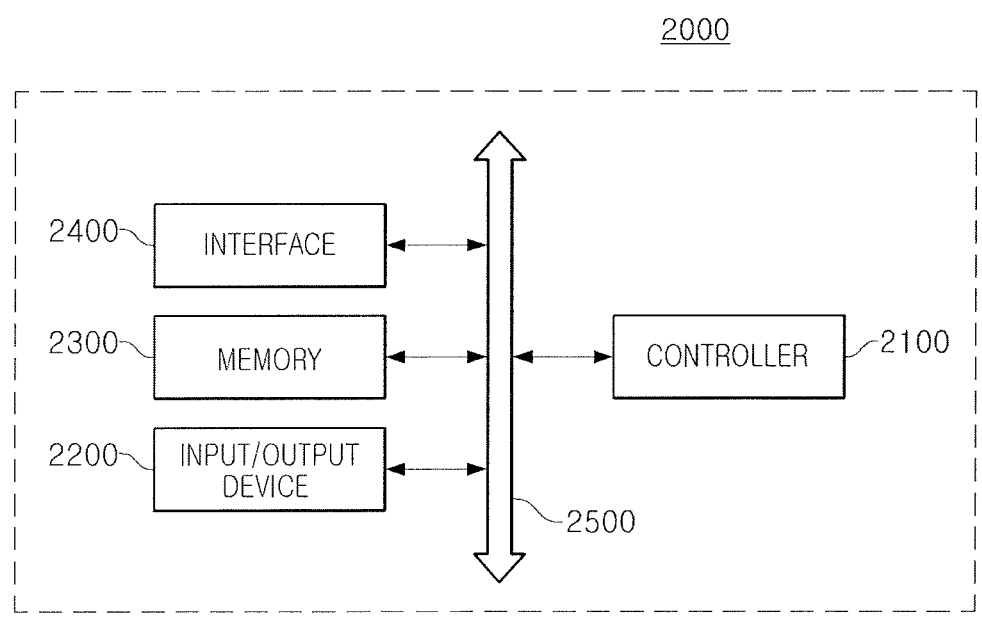
FIG. 11 illustrates a schematic diagram of a system including a semiconductor device according to example embodiments.

FIG. 11 is a schematic diagram illustrating a system including a semiconductor device according to example embodiments.

With reference to FIG. 11, a system 2000 may include a controller 2100, an input/output device 2200, a memory 2300, and an interface 2400. The system 2000 may be a mobile system or a system transmitting or receiving information. The mobile system may be, e.g., a personal digital assistant (PDA), a portable computer, a web tablet, a wireless phone, a mobile phone, a digital music player, or a memory card.

The controller 2100 may execute a program and may serve to control the system 2000. For example, the controller 2100 may be a microprocessor, a digital signal processor, a microcontroller, or a device similar thereto.

The input/output device 2200 may be used to input or output data of the system 2000. The system 2000 may be connected to an external device, e.g., a personal computer or a network to exchange data with the external device, using the input/output device 2200. The input/output device 2200 may be, e.g., a keypad, a keyboard, or a display.

The memory 2300 may store a code and/or data for operations of the controller 2100 therein, and/or may store data processed by the controller 2100 therein.

The interface 2400 may serve as a data transmission path between the system 2000 and an external different device. The controller 2100, the input/output device 2200, the memory 2300, and the interface 2400 may communicate with one another via a bus 2500.

At least one of the controller 2100 or the memory 2300 may include a semiconductor device according to various example embodiments, as described above with reference to FIGS. 1 to 7.

As set forth above, according to example embodiments, by controlling the shape of a gate electrode, a semiconductor device having improved reliability may be provided. Further, a method of manufacturing a semiconductor device having improved reliability may be provided, by firstly recessing a gate spacer layer and then recessing a gate electrode layer. That is, the spacer layers may first be recessed in a fabrication process, followed by etching the gate electrode layer from a side surface as well as an upper surface to have rounded corners, thereby minimizing the width of the gate electrode and increasing a distance between the gate electrode and an adjacent contact plug.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate having an active region;
   a gate structure on the active region, the gate structure including a gate dielectric layer and a gate electrode layer, and the gate electrode layer having a rounded upper corner; and
   gate spacer layers on side surfaces of the gate structure, the gate spacer layers having upper surfaces at a lower height level than an upper surface of the gate electrode layer, the upper surfaces of the gate spacer layers having downwardly convex shapes.

2. The semiconductor device as claimed in claim 1, wherein the gate electrode layer extends in a first direction to intersect the active region, the gate electrode layer having rounded corners on both sides in a second direction perpendicular to the first direction.

3. The semiconductor device as claimed in claim 1, wherein the upper surface of the gate electrode layer has an upwardly convex shape.

4. The semiconductor device as claimed in claim 1, further comprising a gate capping layer covering upper surfaces of the gate electrode layer and the gate spacer layers.

5. The semiconductor device as claimed in claim 4, wherein external side surfaces of the gate spacer layers that are not in contact with the gate structure are coplanar with side surfaces of the gate capping layer.

6. The semiconductor device as claimed in claim 1, wherein the gate dielectric layer covers a lower surface and a side surface of the gate electrode layer, the gate dielectric layer having an upper end at a same height level as the upper surface of the gate electrode layer or at a lower height level than the upper surface of the gate electrode layer on the side surface of the gate electrode layer.

7. The semiconductor device as claimed in claim 6, wherein the upper end of the gate dielectric layer is at a height level closer to upper surfaces of the gate spacer layers than to an uppermost portion of the gate electrode layer.

8. The semiconductor device as claimed in claim 6, wherein:
the gate dielectric layer includes a first gate dielectric layer on the substrate, and a second gate dielectric layer on the first gate dielectric layer and extending onto the side surface of the gate electrode layer, and
the upper end of the gate dielectric layer is an upper end of the second gate dielectric layer.

9. The semiconductor device as claimed in claim 1, wherein an upper end of the gate dielectric layer has a profile continuous with the upper surface of the gate electrode layer.

10. The semiconductor device as claimed in claim 1, wherein an upper end of the gate dielectric layer has a profile continuous with the upper surfaces of the gate spacer layers.

11. The semiconductor device as claimed in claim 1, wherein the gate electrode layer extends in a first direction, the gate electrode layer having a thickness at a central region greater than a thickness at an edge region, the thickness being measured along a second direction perpendicular to the first direction.

12. The semiconductor device as claimed in claim 1, wherein the upper surface of the gate electrode layer has two or more curves.

13. The semiconductor device as claimed in claim 1, wherein the gate electrode layer includes:
a first conductive layer extending onto side surfaces of the gate spacer layers, and
a second conductive layer between portions of the first conductive layer on the side surfaces of the gate spacer layers.

14. The semiconductor device as claimed in claim 1, further comprising:
source/drain regions in the active region located on both sides of the gate structure; and
contact plugs connected to the source/drain regions.

15. A semiconductor device, comprising:
a substrate having an active region and having a first region and a second region;
a first gate electrode layer on the first region to extend in a first direction, the first gate electrode layer having a first length in a second direction perpendicular to the first direction; and
a second gate electrode layer on the second region to extend in the first direction, the second gate electrode layer having a second length greater than the first length in the second direction,
wherein the first gate electrode layer and the second gate electrode layer have a first thickness at an edge region in the second direction, and have a second thickness greater than the first thickness in a region inwardly of the edge region, and
wherein a maximum thickness of the first gate electrode layer is less than a maximum thickness of the second gate electrode layer.

16. The semiconductor device as claimed in claim 15, wherein:
the first and second gate electrode layers have upper rounded corners, and
the semiconductor device further comprises gate spacer layers on sides of the first and second gate electrode layers, respectively, and having an upper surface at a lower height level than upper surfaces of the first and second gate electrode layers.

17. The semiconductor device as claimed in claim 15, wherein an upper surface of the first gate electrode layer has an upwardly convex shape, and an upper surface of the second gate electrode layer has a profile different from a profile of the upper surface of the first gate electrode layer.

18. The semiconductor device as claimed in claim 15, wherein an operating voltage of a first transistor including the first gate electrode layer is lower than an operating voltage of a second transistor including the second gate electrode layer.

19. A semiconductor device, comprising:
a substrate having an active region;
a gate structure on the active region, the gate structure including a gate dielectric layer and a gate electrode layer, and the gate electrode layer having a rounded upper corner;
gate spacer layers on side surfaces of the gate structure, the gate spacer layers having upper surfaces at a lower height level than an upper surface of the gate electrode layer; and
a gate capping layer covering upper surfaces of the gate electrode layer and the gate spacer layers,
wherein external side surfaces of the gate spacer layers that are not in contact with the gate structure are substantially coplanar with side surfaces of the gate capping layer.

* * * * *